(12) United States Patent
Fanous et al.

(10) Patent No.: US 9,348,798 B2
(45) Date of Patent: *May 24, 2016

(54) PARALLEL IMPLEMENTATION OF MAXIMUM A POSTERIORI PROBABILITY DECODER

(71) Applicant: The MathWorks, Inc., Natick, MA (US)

(72) Inventors: Brian J. Fanous, Framingham, MA (US); Halldor N. Stefansson, Natick, MA (US)

(73) Assignee: The MathWorks, Inc., Natick, MA (US)

( * ) Notice: Subject to any disclaimer, the term of this patent is extended or adjusted under 35 U.S.C. 154(b) by 235 days.

This patent is subject to a terminal disclaimer.

(21) Appl. No.: 14/057,132

(22) Filed: Oct. 18, 2013

(65) Prior Publication Data

US 2014/0046995 A1    Feb. 13, 2014

Related U.S. Application Data

(63) Continuation of application No. 13/312,615, filed on Dec. 6, 2011, now Pat. No. 8,594,217.

(51) Int. Cl.
| | | |
|---|---|---|
| *H04L 27/06* | (2006.01) | |
| *G06F 17/16* | (2006.01) | |
| *H03M 13/39* | (2006.01) | |
| *H03M 13/00* | (2006.01) | |

(52) U.S. Cl.
CPC ............ *G06F 17/16* (2013.01); *H03M 13/3905* (2013.01); *H03M 13/3922* (2013.01); *H03M 13/3927* (2013.01); *H03M 13/3966* (2013.01); *H03M 13/616* (2013.01)

(58) Field of Classification Search
CPC ............. G06F 17/16; H03M 13/3905; H03M 13/3922; H03M 13/3927; H03M 13/3966; H03M 13/616
See application file for complete search history.

(56) References Cited

U.S. PATENT DOCUMENTS

| | | | |
|---|---|---|---|
| 6,606,725 B1 * | 8/2003 | Wang et al. | 714/755 |
| 8,019,005 B2 | 9/2011 | Hamamura | |
| 8,107,546 B2 | 1/2012 | Gao et al. | |
| 8,594,217 B2 * | 11/2013 | Fanous et al. | 375/262 |
| 2004/0103359 A1 | 5/2004 | Molina | |
| 2008/0063104 A1 * | 3/2008 | Gardner et al. | 375/262 |

OTHER PUBLICATIONS

Lee et al., "Parallelization of DQMC Simulation for Strongly Correlated Electron Systems", IEEE, Proceedings of the 2010 International Symposium on Parallel & Distributed Processing (IPDPS), Apr. 19, 2010, 9 pages, XP031679869.

(Continued)

*Primary Examiner* — Dac Ha
(74) *Attorney, Agent, or Firm* — Harrity & Harrity, LLP

(57) ABSTRACT

A MAP decoder may be implemented in parallel. In one implementation, a device may receive an input array that represents received encoded data and calculate, in parallel, a series of transition matrices from the input array. The device may further calculate, in parallel, products of the cumulative products of the series of transition matrices and an initialization vector. The device may further calculate, in parallel and based on the products of the cumulative products of the series of transition matrices and the initialization vector, an output array that corresponds to a decoded version of the received encoded data in the input array.

20 Claims, 10 Drawing Sheets

(56) References Cited

OTHER PUBLICATIONS

Wu et al., "Implementation of a 3GPP LTE Turbo Decoder Accelerator on GPU", Proceedings of the 2010 IEEE Workshop on Signal Processing System (SIPS 2010), Oct. 6, 2010, pp. 192-197, XP031792406.

Sazli et al., "Neural Network Implementation of the BCJR Algorithm", Digital Signal Processing, vol. 17, No. 1, Dec. 2, 2006, pp. 353-359, XP005724195.

Garland, "Sparse Matrix Computations on Manycore GPU's", Proceedings of the 45th ACM/IEEE Design Automation Conference 2008, Jun. 8, 2008, pp. 2-6, XP031280852.

Dawid et al., "Map Channel Decoding: Algorithm and VLSI Architecture", Proceedings of Workshop on VLSI Signal Processing, vol. 6, No. VI, Oct. 20, 1993, pp. 141-149, XP002113702.

Notification of Transmittal of the International Search Report and the Written Opinion of the International Searching Authority, or the Declaration corresponding to PCT/US2012/067283, mailed Feb. 8, 2013, 22 pages.

Harris, "Parallel Prefix Sum (Scan) with CUDA", Apr. 2007, 21 pages.

Sadjadpour, "Maximum a Posteriori Decoding Algorithms for Turbo Codes", Proceedings of SPIE vol. 4045, pp. 73-79 (2000).

Wang et al., "Matrix Approach for Fast Implementations of Logarithmic MAP Decoding of Turbo Codes", IEEE, pp. 115-117 (2001).

Co-pending U.S. Appl. No. 13/312,615, by Fanous et al., entitled "Parallel Implementation of Maximum a Posteriori Probability Decoder", filed Dec. 6, 2011, 41 pages.

* cited by examiner

PARALLEL IMPLEMENTATION OF MAXIMUM A POSTERIORI PROBABILITY DECODER

RELATED APPLICATION

This application is a continuation of U.S. patent application Ser. No. 13/312,615 filed Dec. 6, 2011, which is incorporated herein by reference.

BACKGROUND

The maximum a posteriori probability (MAP) decoder, and/or variations of this decoder, is commonly used for signal processing. For instance, a MAP decoder may be used, as part of a larger decoder, such as a turbo decoder, in a wireless communication device. The turbo decoder may be used to decode data that is received over a noisy channel, such as radio interfaces for the wireless communication device.

A number of variations of the MAP decoder are known. The logarithmic version of the MAP decoder, for example, may be more feasible for practical hardware implementations. Whatever version of the MAP decoder is used, however, it can be desirable to implement the MAP decoder as efficiently as possible, with respect to available hardware constraints.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

The following detailed description refers to the accompanying drawings. The same reference numbers in different drawings may identify the same or similar elements.

Implementations described herein may relate to a parallel implementation of the MAP decoder. A number of processing units, such as hardware processing units in an electronic device, may efficiently implement a MAP decoder, such as a MAP decoder implemented as part of a turbo decoder. In one implementation, the MAP decoder may be designed and/or deployed in a technical computing environment (TCE).

To implement the MAP decoder, a scan algorithm may be used for a parallel computation of intermediate results. For example, the scan algorithm may be used to calculate products of the cumulative products of a series of transition matrices and an initialization vector. The scan algorithm, and hence the MAP decoder, may be performed by parallel processing units.

Definitions

A Technical Computing Environment (TCE) may include any hardware and/or software based logic that provides a computing environment that allows users to perform tasks related to disciplines, such as, but not limited to, mathematics, science, engineering, medicine, and business. The TCE may include text-based facilities (e.g., MATLAB® software), a graphically-based environment (e.g., Simulink® software, Stateflow® software, SimEvents™ software, etc., by The MathWorks, Inc.; VisSim by Visual Solutions; LabView® by National Instruments; etc.), or another type of environment, such as a hybrid environment that includes one or more of the above-referenced text-based environments and one or more of the above-referenced graphically-based environments.

The TCE may be integrated with or operate in conjunction with a graphical modeling environment, which may provide graphical tools for constructing models, systems, or processes. The TCE may include additional tools, such as tools designed to convert a model into an alternate representation, such as source computer code, compiled computer code, or a hardware description (e.g., a description of a circuit layout). In one implementation, the TCE may provide this ability using graphical toolboxes (e.g., toolboxes for signal processing, image processing, color manipulation, data plotting, parallel processing, etc.). In another implementation, the TCE may provide these functions as block sets. In still another implementation, the TCE may provide these functions in another way.

Models generated with the TCE may be, for example, models of a physical system, a computing system (e.g., a distributed computing system), an engineered system, an embedded system, a biological system, a chemical system, etc.

System Description

Figure 1:
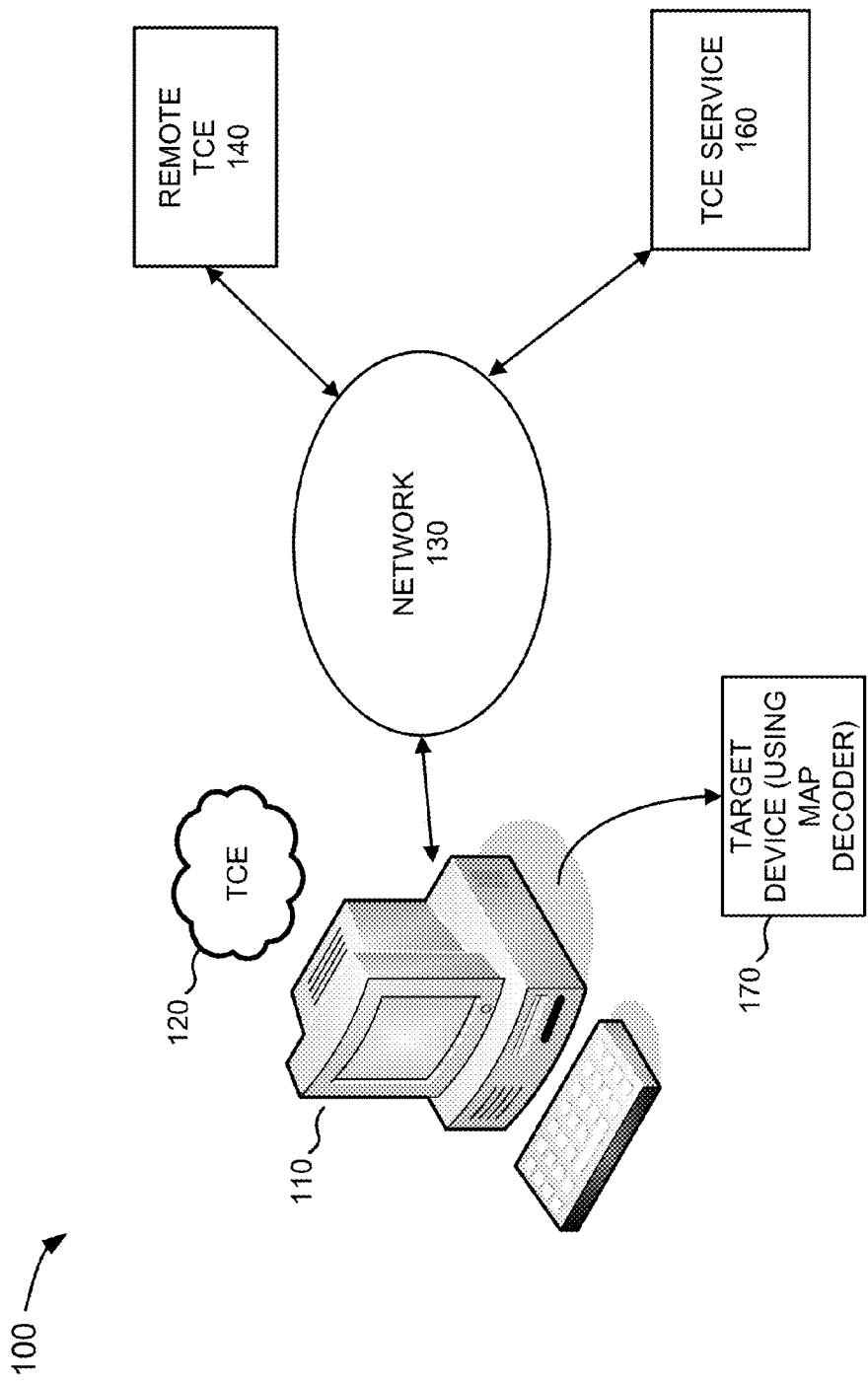
FIG. 1 is a diagram of an example system in which concepts described herein may be implemented.

FIG. 1 is diagram of an example system 100 in which concepts described herein may be implemented. System 100 may include a personal computer or workstation 110. Workstation 110 may execute a TCE 120 that presents a user with an interface that enables design, analysis, and generation of, for example, technical applications, engineered systems, and business applications. For example, TCE 120 may provide a numerical and/or symbolic computing environment that allows for matrix manipulation, plotting of functions and data, implementation of algorithms, creation of user interfaces, and/or interfacing with programs in other languages. TCE 120 may particularly include a graphical modeling component and a component to convert graphic models into other forms, such as computer source code (e.g., C++ code) or hardware descriptions (e.g., a description of an electronic circuit).

Workstation 110 may operate as a single detached computing device. Alternatively, workstation 110 may be connected to a network 130, such as a local area network (LAN) or a wide area network (WAN), such as the Internet. When workstation 110 is connected to network 130, TCE 120 may be run by multiple networked computing devices or by one or more remote computing devices. In such an implementation, TCE 120 may be executed in a distributed manner, such as by executing on multiple computing devices simultaneously. Additionally, in some implementations, TCE 120 may be executed over network 130 in a client-server relationship. For example, workstation 110 may act as a client that communicates (e.g., using a web browser) with a server that stores and potentially executes substantive elements of TCE 120.

As shown in FIG. 1, system 100 may include a remote TCE 140 (e.g., a remotely located computing device running a TCE) and/or a TCE service 160. TCE service 160 may include a server computing device that provides a TCE as a remote service. For instance, a TCE may be provided as a web service. The web service may provide access to one or more programs provided by TCE service 160.

In one implementation, models created with TCE 120 may be executed at workstation 110 to present an interface, such as a graphical interface, to a user. In some implementations, TCE 120 may generate, based on the model, code that is executable on another device, such as a target device 170. Target device 170 may include, for example, a consumer electronic device, a factory control device, an embedded device, a general computing device, a graphics processing unit or device, a field programmable gate array, an application specific integrated circuit (ASIC), or any other type of programmable device. In one implementation, target device 170 may particularly include a communication device or a semiconductor chip within a communication device, such as a wireless communication device.

Target device 170, workstation 110, and/or remote TCE 140 may include multiple, parallel processing engines. For example, workstation 110 may include a multicore processor. Similarly, target device 107 may include a multicore processor or may include parallel processing engines that may be used for signal processing tasks. As will be described in more detail below, multiple, parallel processing engines of target device 170, workstation 110, and/or remote TCE 140, may be used to efficiently implement a MAP decoder.

Although FIG. 1 shows example components of system 100, in other implementations, system 100 may contain fewer components, different components, differently arranged components, and/or additional components than those depicted in FIG. 1. Alternatively, or additionally, one or more components of system 100 may perform one or more other tasks described as being performed by one or more other components of system 100.

Figure 2:
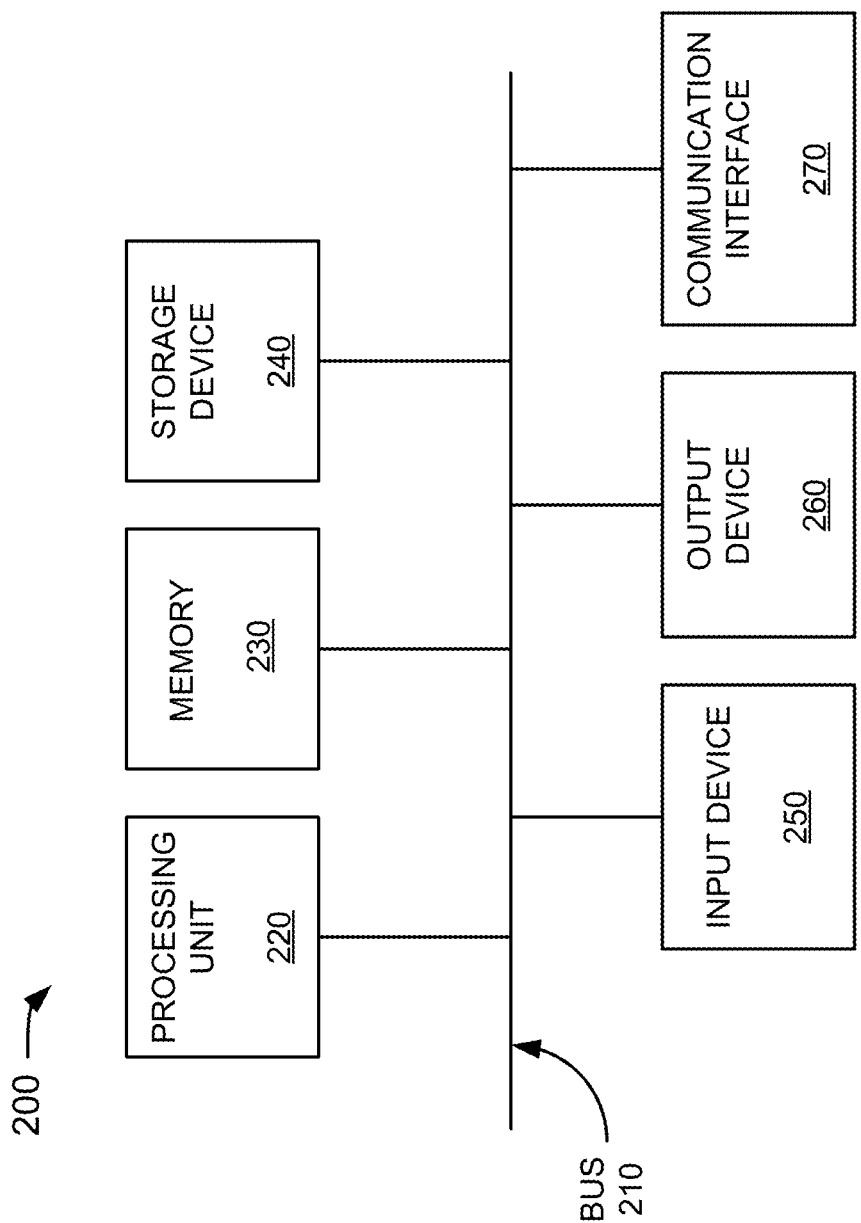
FIG. 2 is a diagram of an example device that may correspond to a device in FIG. 1.

FIG. 2 is a diagram of an example device 200 that may correspond to workstation 110, target device 170, or a remote device running remote TCE 140 or TCE service 160. As illustrated, device 200 may include a bus 210, a processing unit 220, a main memory 230, a read-only memory (ROM) 240, a storage device 250, an input device 260, an output device 270, and/or a communication interface 280. Bus 210 may include a path that permits communication among the components of workstation 200.

Processing unit 220 may interpret and/or execute instructions. For example, processing unit 220 may include a general-purpose processor, a microprocessor, a multicore microprocessor, a data processor, a graphical processing unit (GPU), co-processors, a network processor, an application specific integrated circuit (ASICs), an application specific instruction-set processor (ASIP), a system-on-chip (SOC), a controller, a programmable logic device (PLD), a chipset, and/or a field programmable gate array (FPGA).

Memory 230 may store data and/or instructions related to the operation and use of device 200. For example, memory 230 may store data and/or instructions that may be configured to implement an implementation described herein. Memory 230 may include, for example, a random access memory (RAM), a dynamic random access memory (DRAM), a static random access memory (SRAM), a synchronous dynamic random access memory (SDRAM), a ferroelectric random access memory (FRAM), a read only memory (ROM), a programmable read only memory (PROM), an erasable programmable read only memory (EPROM), an electrically erasable programmable read only memory (EEPROM), and/or a flash memory.

Storage device 240 may store data and/or software related to the operation and use of device 200. For example, storage device 240 may include a hard disk (e.g., a magnetic disk, an optical disk, a magneto-optic disk, a solid state disk), a compact disc (CD), a digital versatile disc (DVD), a floppy disk, a cartridge, a magnetic tape, and/or another type of computer-readable medium, along with a corresponding drive. Memory 230 and/or storage device 240 may also include a storing device external to and/or removable from device 200, such as a Universal Serial Bus (USB) memory stick, a hard disk, etc. In an implementation, storage device 240 may store TCE 120.

Input device 250 may include a mechanism that permits an operator to input information to device 200, such as a keyboard, a mouse, a pen, a single or multi-point touch interface, an accelerometer, a gyroscope, a microphone, voice recognition and/or biometric mechanisms, etc. Output device 260 may include a mechanism that outputs information to the operator, including a display, a printer, a speaker, etc. In the case of a display, the display may be a touch screen display that acts as both an input and an output device. Input device 250 and/or output device 260 may be haptic type devices, such as joysticks or other devices based on touch.

Communication interface 270 may include any transceiver-like mechanism that enables device 200 to communicate with other devices and/or systems. For example, communication interface 270 may include mechanisms for communicating with another device or system via a network.

As will be described in detail below, device 200 may perform certain operations in response to processing unit 220 executing software instructions contained in a computer-readable medium, such as memory 230. For instance, device 200 may implement TCE 120 by executing software instructions from memory 230. A computer-readable medium may be defined as a non-transitory memory device, where the memory device may include a number of physically, possible distributed, memory devices. The software instructions may be read into memory 230 from another computer-readable medium, such as storage device 240, or from another device via communication interface 270. The software instructions contained in memory 230 may cause processing unit 220 to perform processes that will be described later. Alternatively, hardwired circuitry may be used in place of or in combination with software instructions to implement processes described herein. Thus, implementations described herein are not limited to any specific combination of hardware circuitry and software.

Although FIG. 2 shows example components of device 200, in other implementations, device 200 may contain fewer components, different components, differently arranged components, or additional components than depicted in FIG. 2. Alternatively, or additionally, one or more components of device 200 may perform one or more tasks described as being performed by one or more other components of device 200.

Parallel Implementation of Map Decoder

In general, a MAP decoder may be used as a common decoding solution for an error-control coding system. A MAP decoder may implement a trellis-based estimation technique in which the MAP decoder produces soft decisions relating to the state of a block of inputs. MAP decoders may be frequently used in the context of a larger decoder, such as a turbo decoder, where two or more component MAP decoders may be used, and the coding may involve iteratively feeding outputs from the MAP decoders to one another until a final decision is reached on the state of the communicated information, called the message.

Figure 3:
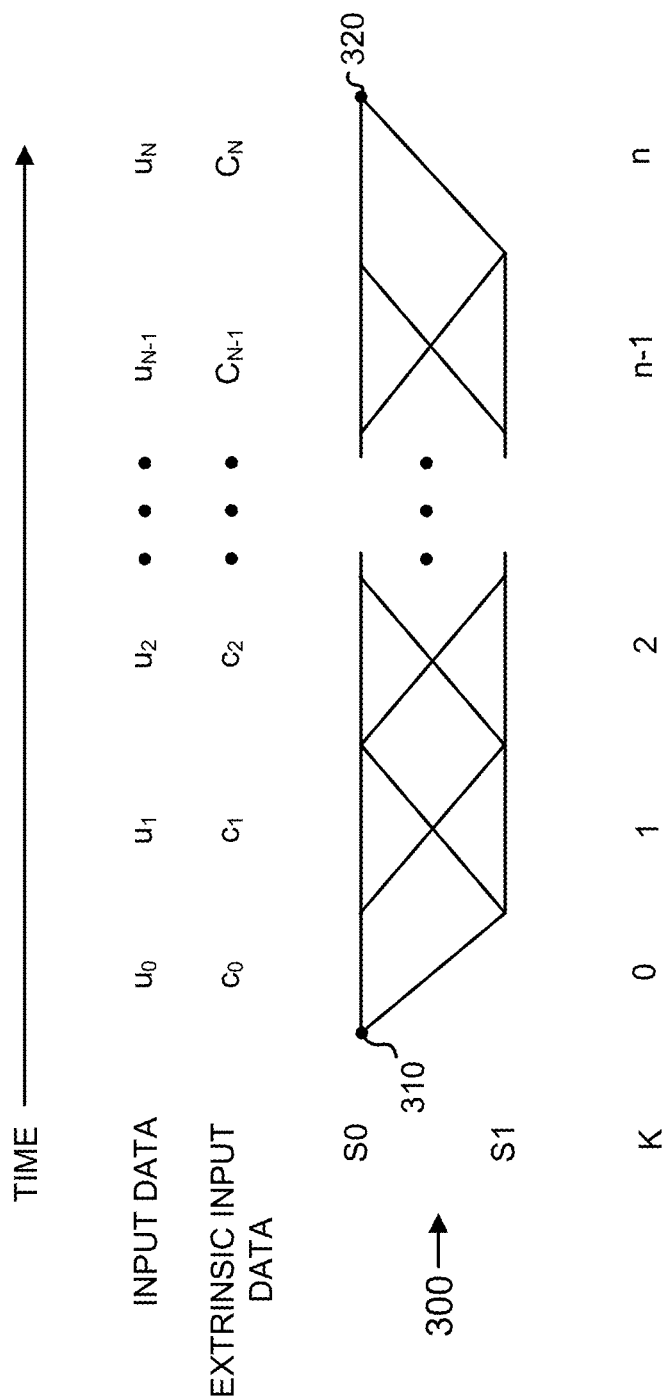
FIG. 3 is a diagram illustrating an example of a simplified trellis.

FIG. 3 is a diagram illustrating an example of a simplified trellis 300. Trellis 300 may represent correspondences between codewords (i.e., an input sequence of data bits) and paths from the beginning of the trellis, shown as node 310, and the end of the trellis, shown as node 320. Trellis 300 may be considered to be a definite finite automaton with one start state and one finish state. Given a received, possibly error-corrupted codeword, error probabilities may be associated with weights on the edges (the lines between the nodes) of trellis 300. A MAP decoder is one technique for estimating the message or minimizing code symbol errors.

In FIG. 3, a transmitted length N data block $u_k$ (0≤k≤N) and a corresponding sequence $c_k$ of extrinsic input data, is shown. In this example, trellis 300 is illustrated as a two state, states S0 and S1, trellis. In practice, trellis 300 may include additional states. In general, trellis 300 may be a sparse data structure in which not all states are connected by an edge.

Figure 4:
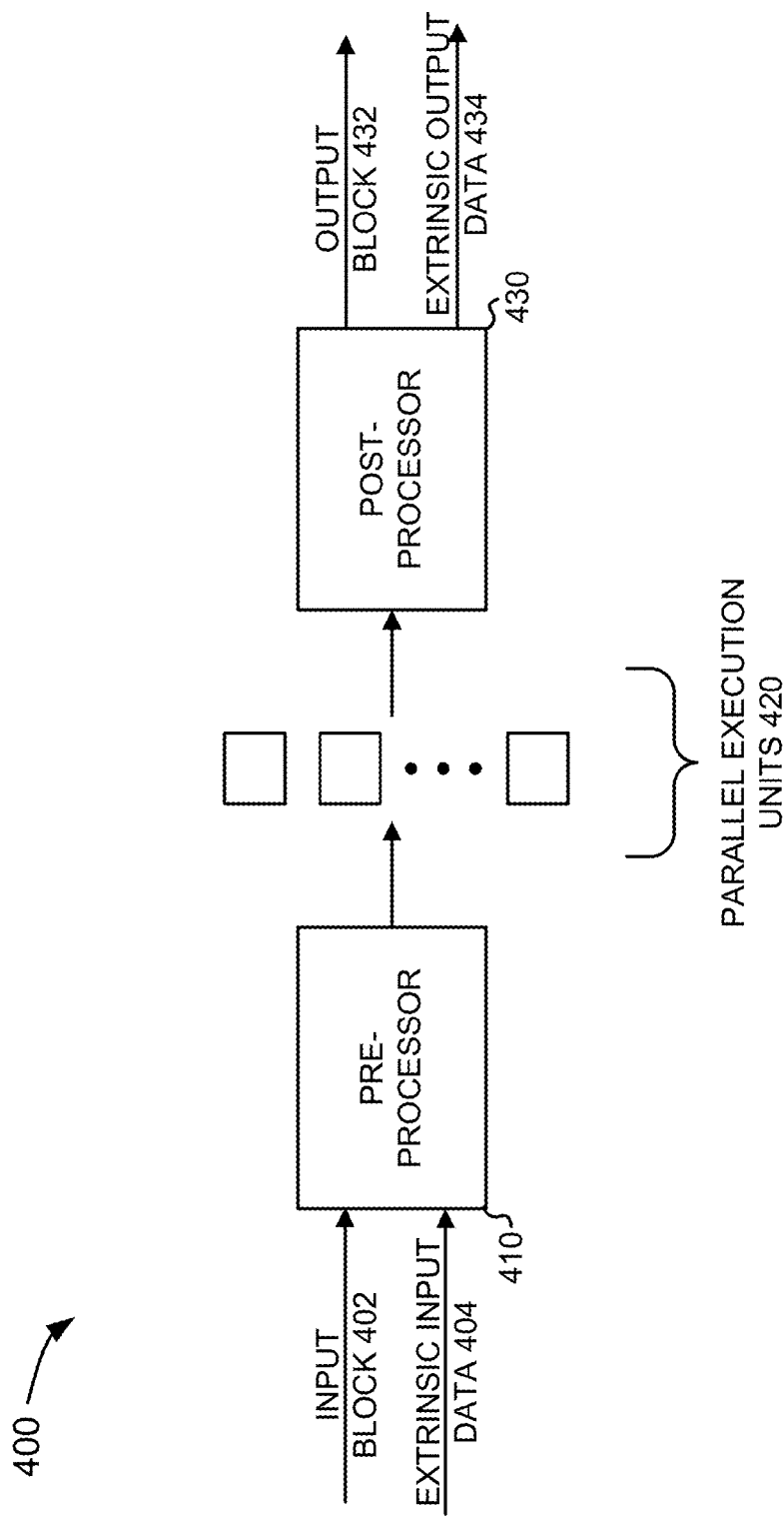
FIG. 4 is a diagram conceptually illustrating example components of a MAP decoder.

FIG. 4 is a diagram conceptually illustrating example components of a MAP decoder 400. MAP decoder 400 may be implemented, for example, as a model in TCE 120 or as part of target device 170.

MAP decoder 400 may include pre-processor component 410, parallel execution units 420, and post-processing component 430. MAP decoder 400 may operate to compute the likelihood, such as the Log-Likelihood Ratio (LLR), of each bit or symbol, of an input data block, being correct. MAP decoder 400 may receive, at pre-processor component 410, a length N data block 402 and may receive extrinsic input data 404. Extrinsic input data 404 may include, for example, parity bits and/or LLR values from a previous iteration of MAP decoder 400 (or from another MAP decoder). MAP decoder 400 may output, from post-processor component 430, a length N output data block 432 and extrinsic output data 434. The extrinsic output data 434 may include, for example, updated LLR values.

The MAP decoding technique may be based on the calculation of a number of parameters, commonly called the alphas, $\alpha_k$, the betas, $\beta_k$, and the gammas, $\gamma$. The alphas may be computed through a forward recursion operation, the betas may be computed through a backwards recursion operation, and the gammas may include the transition probability of a channel and transition probabilities of an encoder trellis. In one implementation, the alphas and betas may be defined as:

$$\alpha_k(s) = \sum_{s'} \gamma_j(s', s)\alpha_{k-1}(s');$$

and $$\beta_k(s) = \sum_{s'} \gamma_j(s, s')\beta_{k+1}(s')$$

Here, s and s' may represent states of the decoder, and $\gamma_j(s', s)$ may represent the transition probability of the channel and transition probabilities of the encoder trellis. The gammas may be defined as:

$$\gamma_j(s',s)=Pr(S_k=s,R_j|S_{k-1}=s')$$

where $S_k$ is the state at time k and the input block and parity sequence is $R_1^N=\{R_1, \ldots, R_k, \ldots, R_N\}$ and $R_i=\{u_i,c_i\}$.

The forward recursion, the alphas, can be modeled as products of the cumulative matrix product of several square transition matrices (one matrix per received symbol) and an initialization vector. Backwards recursion can be described as products of the right-to-left cumulative matrix product of different transition matrices and the initialization vector. For example, in a two state trellis, each recursive computation may be described in matrix form, as in:

$$\begin{bmatrix} \alpha_k(s0) \\ \alpha_k(s1) \end{bmatrix} = \begin{bmatrix} \gamma_k(0, 0)\gamma_k(1, 0) \\ \gamma_k(0, 1)\gamma_k(1, 1) \end{bmatrix} * \begin{bmatrix} \alpha_{k-1}(s0) \\ \alpha_{k-1}(s1) \end{bmatrix} \quad \text{(Eq. 1)}$$

These formulas can be equivalently written as:

$$A_k=G_k*A_{k-1},$$

where $A_k$ represents a column vector of the alphas and $G_k$ represents a square matrix, which will also be referred to as transition matrices herein. The transition matrices may generally be relatively sparse. Based on the above equations, the following equation can be derived:

$$A_n=G_n*G_{n-1}*G_{n-2}*\ldots*G_1*A_0.$$

From this, the forward recursion may be performed by left multiplying $A_0$, the initialization vector, by each element of the cumulative matrix product of $\{G_n, G_{n-1}, G_{n-2}, \ldots, G_1\}$. For example, for three symbols, the alphas may be calculated as:

$$A_3=G_3*G_2*G_1*A_0,$$

$$A_2=G_2*G_1A_0, \text{and}$$

$$A_1=G_1*A_0,$$

Consistent with aspects described herein, the products of the cumulative products of the transition matrices and the initialization vector, as included in these equations, may be efficiently calculated, in parallel, based on the scan algorithm.

The backwards recursion, the betas, can be similarly modeled as products of the cumulative matrix product of a second set of transition matrices (different than the transition matrices for the alphas) and the initialization vector. The scan algorithm may also be used to efficiently calculate, in parallel, the products of the cumulative products of the transition matrices (for the betas) and the initialization vector.

Pre-processor component 410 may receive input block 402 and extrinsic input data 404. Pre-processor component 410 initiates and controls the data flow through parallel execution units 420. In one implementation, the quantity of the parallel execution units 420 may be equal to N/2, where N is the size of input block 402.

Parallel execution units 420 may include multiple, parallel executing processors, application specific integrated circuits (ASICs), field programmable gate arrays (FPGAs), graphic processing units (GPUs), software threads running on a general processor, or other execution units. Parallel execution units 420 may calculate, in parallel, the transition matrices, $G_n$ (for both the alphas and the betas); calculate, in parallel, each of the products of the cumulative products of the transition matrices and the initialization vector $A_0$; and convert, in parallel, the products of the cumulative products of the transition matrices and the initialization vector, for both the alphas and the betas, to an output vector. Parallel execution units 420 may perform these operations in a pipelined manner in which there is communication between different parallel execution units 420.

As previously mentioned, the calculation of the products of the cumulative products of the transition matrices and the initialization vector may be performed according to the scan algorithm. In one implementation, an initialization vector may be defined based on the particular MAP decoder being implemented. The initialization vector may be a constant value that is used in parallel execution units 420 and is illustrated as a vector. The initialization vector is illustrated as $A_0$ in the above equations. The scan algorithm may then be implemented, by parallel execution unit 420, to calculate products of the cumulative products of the transition matrices and the initialization vector (for both the alphas and the betas).

Post-processor 430 may perform any final, serial processing of the results from parallel execution units 420, and may output block 432 and extrinsic output data 434.

Although FIG. 4 shows example components of MAP decoder 400, in other implementations, MAP decoder 400 may contain fewer components, different components, differently arranged components, and/or additional components than those depicted in FIG. 4. Alternatively, or additionally, one or more components of MAP decoder 400 may perform one or more tasks described as being performed by one or more other components of MAP decoder 400.

Figure 5:
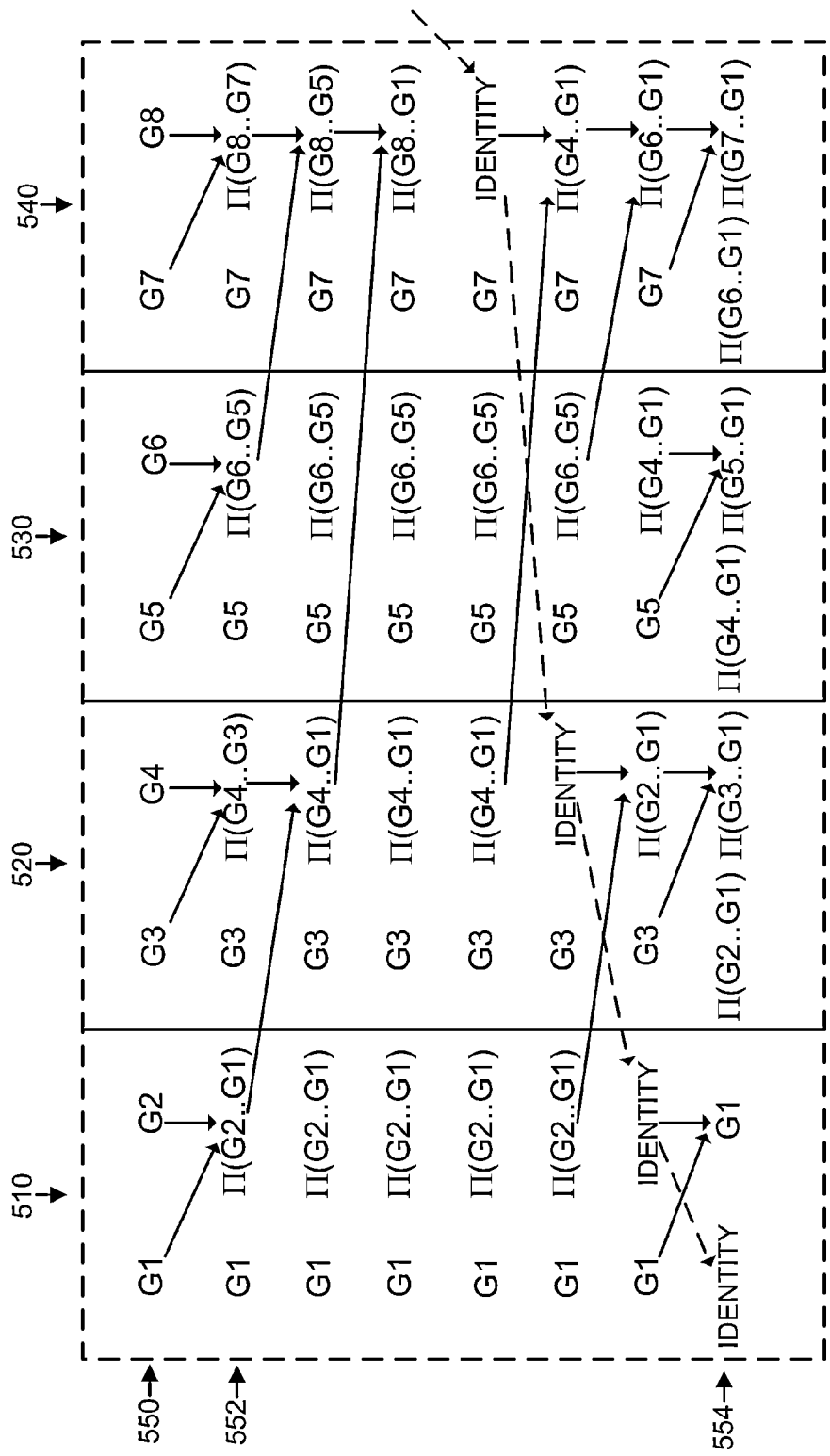
FIG. 5 is a diagram illustrating an example of the operation of the parallel execution units of FIG. 4 using a scan technique.

FIG. 5 is a diagram illustrating an example of the operation of parallel execution units 420 in calculating, based on the scan algorithm, partial products of the cumulative products of transition matrices. The operations shown in FIG. 5 may be separately performed, in parallel, to determine the partial products of the cumulative products of transition matrices for both the alphas and the betas.

In this example, four parallel execution units are shown, labeled as parallel execution units 510, 520, 530, and 540. For this example, assume that the input array includes eight transition matrices (i.e., N=8). The set of transition matrices includes the set: $\{G_8, G_7, G_6, G_5, G_4, G_3, G_2, G_1\}$. In a first pipeline stage 550 (i.e., the first step in the implementation of the scan algorithm), parallel execution unit 510 may receive the transition matrices $G_1$ and $G_2$, parallel execution unit 520 may receive the transition matrices $G_3$ and $G_4$, parallel execution unit 530 may receive the transition matrices $G_5$ and $G_6$, and parallel execution unit 540 may receive the transition matrices $G_7$ and $G_8$.

In a second stage 552 of the pipelines, parallel execution unit 510 may calculate the product of transition matrices $G_1$ and $G_2$ ($\Pi(G_1 \ldots G_2)$). Simultaneously, parallel execution unit 520 may calculate the product of transition matrices $G_3$ and $G_4$ ($\Pi(G_4 \ldots G_3)$); parallel execution unit 530 may calculate the product of transition matrices $G_5$ and $G_6$ ($\Pi(G_6 \ldots G_5)$); and parallel execution unit 540 may calculate the product of transition matrices $G_7$ and $G_8$ ($\Pi(G_8 \ldots G_7)$). Additionally, in the second stage of the pipelines, parallel execution unit 510 may store transition matrix $G_1$, parallel execution unit 530 may store transition matrix $G_3$, parallel execution unit 530 may store transition matrix $G_5$, and parallel execution unit 540 may store transition matrix $G_7$. As illustrated, each succeeding stage of the pipelines may involve one or more matrix product calculations or transfer previous matrix product calculation to a different one of the pipelines implemented by the parallel execution units.

In the final stage of the pipeline, labeled as stage 554, each of parallel execution units 510, 520, 530, and 540, may output a portion of the partial products of the transition matrices, to obtain the partial products of the transition matrices. The matrix multiplication operations, $\Pi$, illustrated in FIG. 5, may refer to operations other than standard matrix multiplication operations, depending on the version of the MAP decoder that is being implemented. For example, the original MAP decoder algorithm may be relatively computationally intensive. The Max-Log-MAP decoder technique is one known variation of the MAP decoder. In general, the Max-Log-MAP may be based on using the natural logarithm of the alphas, betas, and gammas. For the Max-Log-MAP implementation, scalar multiplication may be replaced with addition and scalar addition may be replaced with the maximum operation. With these replacements, the matrix multiplication may be performed as illustrated in FIG. 5. Other MAP decoder techniques, such as the Log-MAP may alternatively be used.

Figure 6:
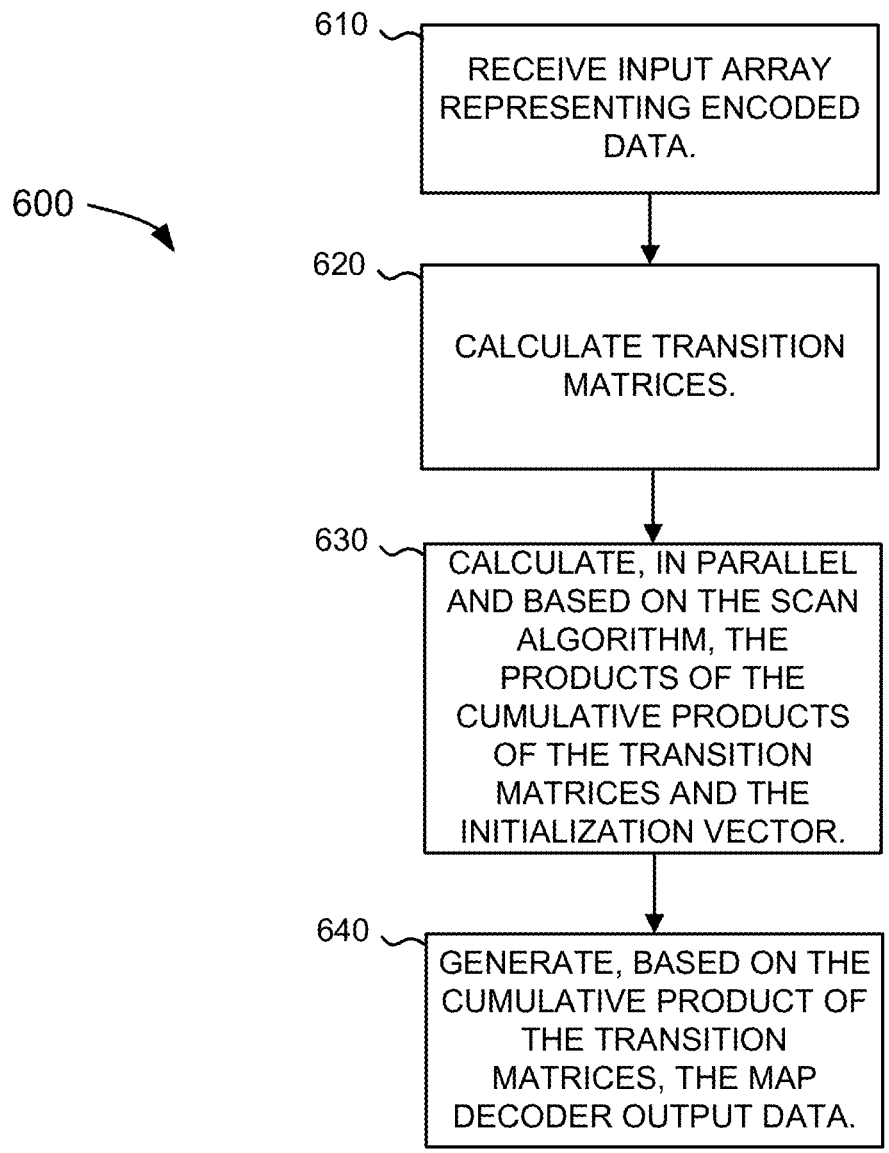
FIG. 6 is a flowchart illustrating an example process for the parallel implementation of a MAP decoder.

FIG. 6 is a flowchart illustrating an example process 600 for the parallel implementation of a MAP decoder. Process 600 may be performed by, for example, MAP decoder 400.

Process 600 may include receiving an input array that represents the encoded data (block 610). The input array may be a fixed length array and may include encoded data received over a noisy channel, including parity bits added during the encoding (i.e., at the transmitting end of the noisy channel). The input array may also include extrinsic input data.

Process 600 may further include calculating the transition matrices (block 620). In one implementation, the transition matrices, G, may be calculated as discussed above with reference to equation (1). The transition matrices may be calculated, in parallel, by parallel execution units 420. The transition matrices may be calculated for both the alphas and the betas.

Process 600 may further include, based on the transition matrices and using the scan algorithm, calculation of the products of the cumulative products of the transition matrices and an initialization vector (block 630). The initialization vector may be a constant valued vector that is defined based on the particular MAP decoder that is being implemented. The calculation of block 630 may be performed in parallel using the scan algorithm. In one implementation, the parallel processing may be performed, in a pipelined manner, using a quantity of processing units 420. The quantity of processing units required for a maximally parallel implementation may be, for instance, N/2, where N may represent the number of transition matrices and each processing unit may implement a pipeline having $2*\log_2(N)$ stages. Block 630 may be performed, in parallel, for both the alphas and the betas.

Process 600 may further include generating, based on the products of the cumulative products of the transition matrices and the initialization vector, as calculated in block 630, the MAP decoder output data (block 640). The calculation of block 640 may be performed, in parallel, by parallel execution units 420. The calculation of block 640 may include forming the output based on both sets (i.e., the alpha and the beta sets) of the products of the cumulative products of the transition matrices and the initialization vector. The output data may generally correspond to a decoded version of the received encoded data, such as output block 432 and extrinsic output data 434.

In one particular example of an implementation of process 600, process 600 may be implemented on target device 170 that includes multiple, parallel, GPUs. In some implementations, data sent to the multiple GPUs may be sent in a "batch" mode to potentially hide memory latency and increase throughput.

Figure 7:
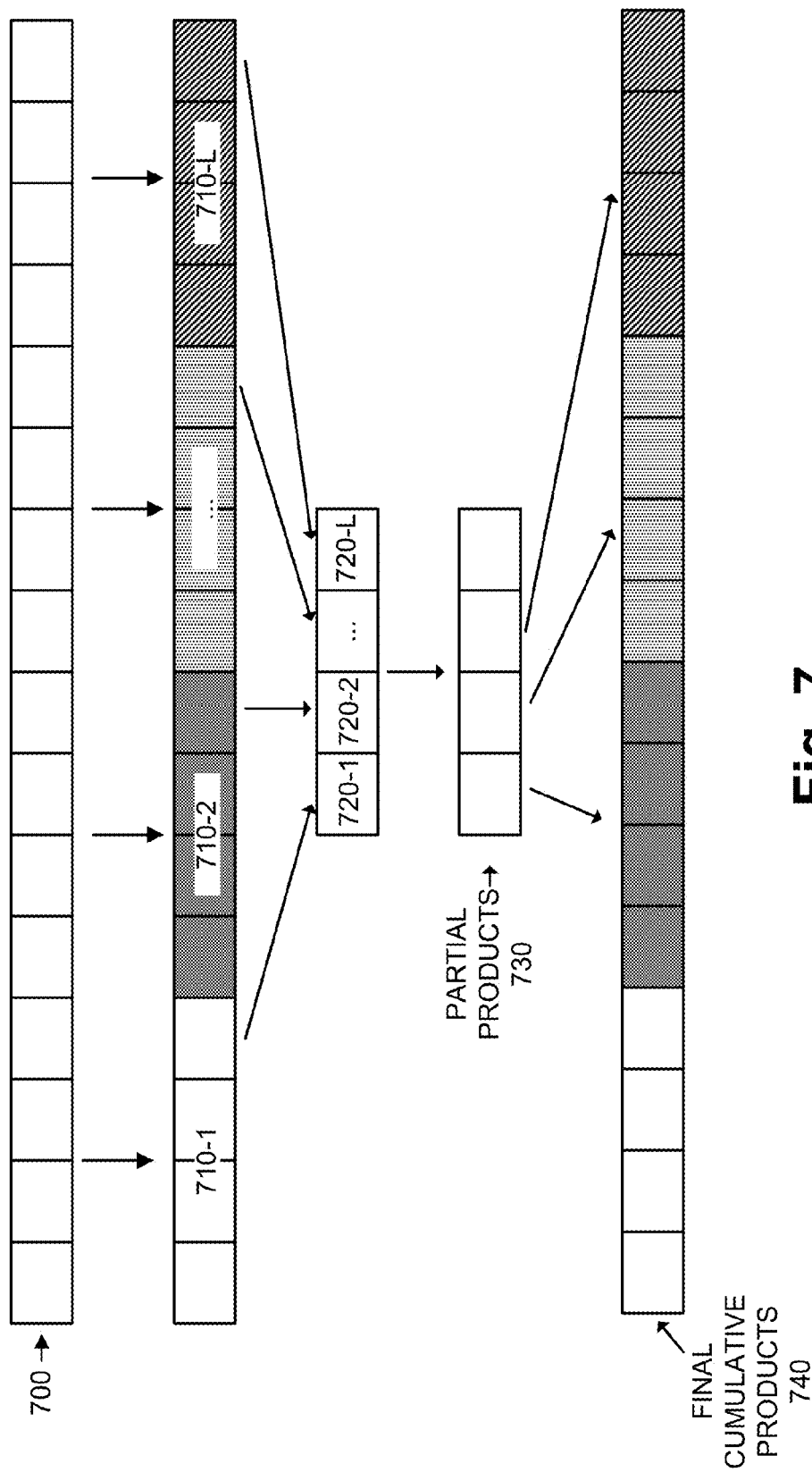
FIG. 7 is a diagram illustrating an alternative example implementation of the scan technique.

FIG. 7 is a diagram illustrating an alternative example implementation of the scan technique. In the implementations illustrated in FIG. 7, the cumulative products of the transition matrices may be performed as a three stage operation.

As shown in FIG. 7, transition matrices 700 may be segmented into a number of independent subsegments 710-1 through 710-L (referred to collectively as "subsegments 710" or individually as "subsegment 710"). The scan operation may be applied to each of subsegments 710 and the full product of each scan may be stored, illustrated as full products 720-1 through 720-L (referred to collectively as "full products 720" or individually as "full product 720"). The scan operation may then again be applied to full products 720 to obtain partial products 730. Partial products 730 may then be distributed to obtain final cumulative products 740. Although not explicitly shown in FIG. 7, the initialization vector may also be multiplied as part of the operations in FIG. 7, such that the final cumulative products 740 may represent the products of the cumulative products of the transition matrices and the initialization vector. By segmenting the transition matrices into a series of groups of transition matrices, and then independently applying the scan operation to each group, as illustrated in FIG. 7, the scan operation can potentially be more efficiently and/or more quickly performed.

In the techniques shown in FIG. 7, the initialization vector may be multiplied after performing matrix by matrix multiplications or before performance of the matrix by matrix multiplications. In one implementation, the matrix by vector multiplications (e.g., multiplications of matrices by the initialization vector) may be preferentially performed before matrix by matrix multiplications, which may lead to a more computationally efficient process.

Figure 8:
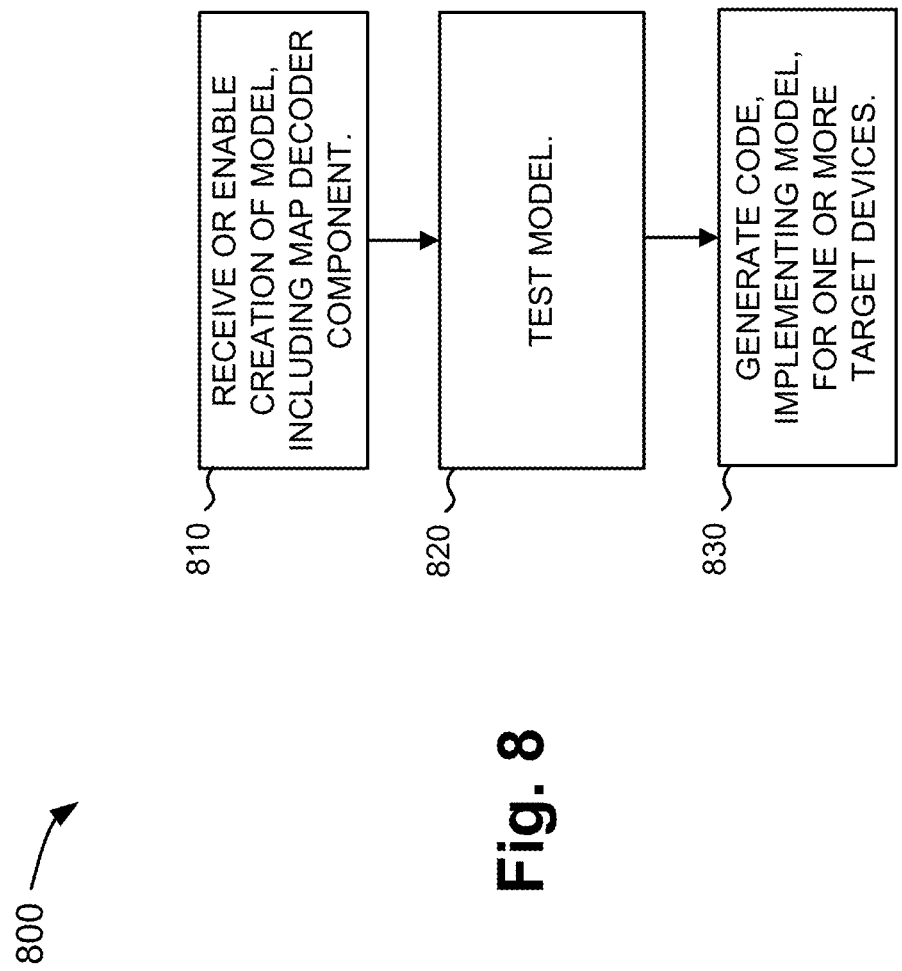
FIG. 8 is a flowchart illustrating an example process for generating a model that uses a MAP decoder.

FIG. 8 is a flow chart illustrating an example process 800 for generating a model that uses a MAP decoder. Process 800 may be performed by, for example, workstation 110, running TCE 120.

Process 800 may include receiving a model or otherwise enabling or facilitating the creation of a model (block 810). The model may include a MAP decoder component (block 810). The MAP decoder component may implement MAP decoding using multiple parallel processing units, such as processing units 420. In one implementation, the MAP decoder component for the model may include parameters that allow a designer to specify the hardware elements that are to implement the parallel computations. The MAP decoder component may be implemented with other components to perform a larger or more complex function. For example, a turbo decoder may be implemented using multiple MAP decoder components that are connected to one another using other model components, such as interleavers.

Process 800 may further include testing the model (block 820). For example, the model may be run by TCE 120 and values for parameters in the model may be observed. In response, the user may, for example, interactively, through TCE 120, modify the operation of the model.

At some point, the user may determine that the model is ready for deployment in a target device. At this point, process 800 may further include generating code, to implement the model, on one or more target devices (block 830). For example, the user may control TCE 120 to generate compiled code for target device 170. In another possible implementation, the generated code may be code that controls programming of a hardware device, such as code that specifies the layout of an ASIC or FPGA.

Figure 9:
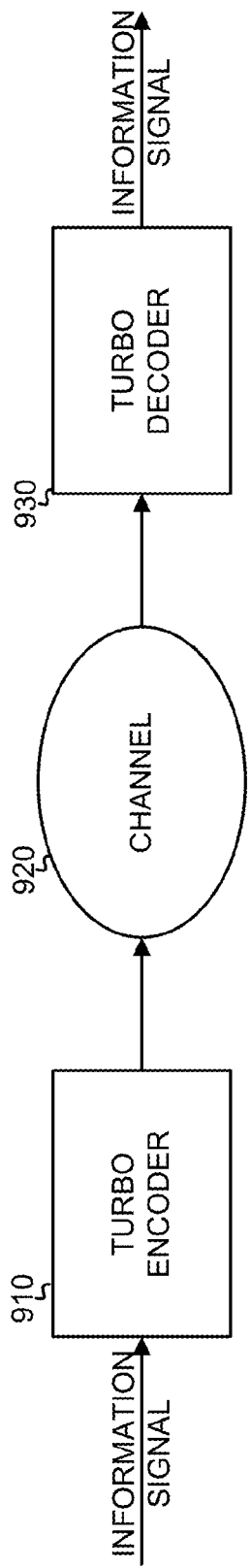
FIG. 9 is a diagram illustrating an example system that may use a MAP decoder.

FIG. 9 is a diagram illustrating an example system 900 that may use a MAP decoder. System 900 may be a communication system in which information is transmitted across a noisy channel. As shown, system 900 may include turbo encoder 910, channel 920, and turbo decoder 930.

Turbo encoder 910 may operate to encode an input information signal, to include redundant data, to make the information signal resistant to noise that may be introduced through channel 920. For example, turbo encoder 910 may include two recursive systematic convolutional (RSC) encoders that each generate parity bits that are included with the information signal when transmitted over channel 920.

Channel 920 may include a noisy channel that may tend to introduce errors into the signal output from turbo encoder 910. For example, channel 920 may be an over-the-air radio channel, optical-based channel, or other channel that may tend to introduce noise.

Turbo decoder 930 may receive the encoded signal, after it is communicated over channel 920, and may act to decode the encoded signal, to ideally obtain the original input information signal. Turbo decoder 930 may include multiple MAP decoders and one or more interleavers. A number of designs for turbo decoder 930 are known. One example of a design for a particular turbo decoder 930 is described in more detail with respect to FIG. 10.

Figure 10:
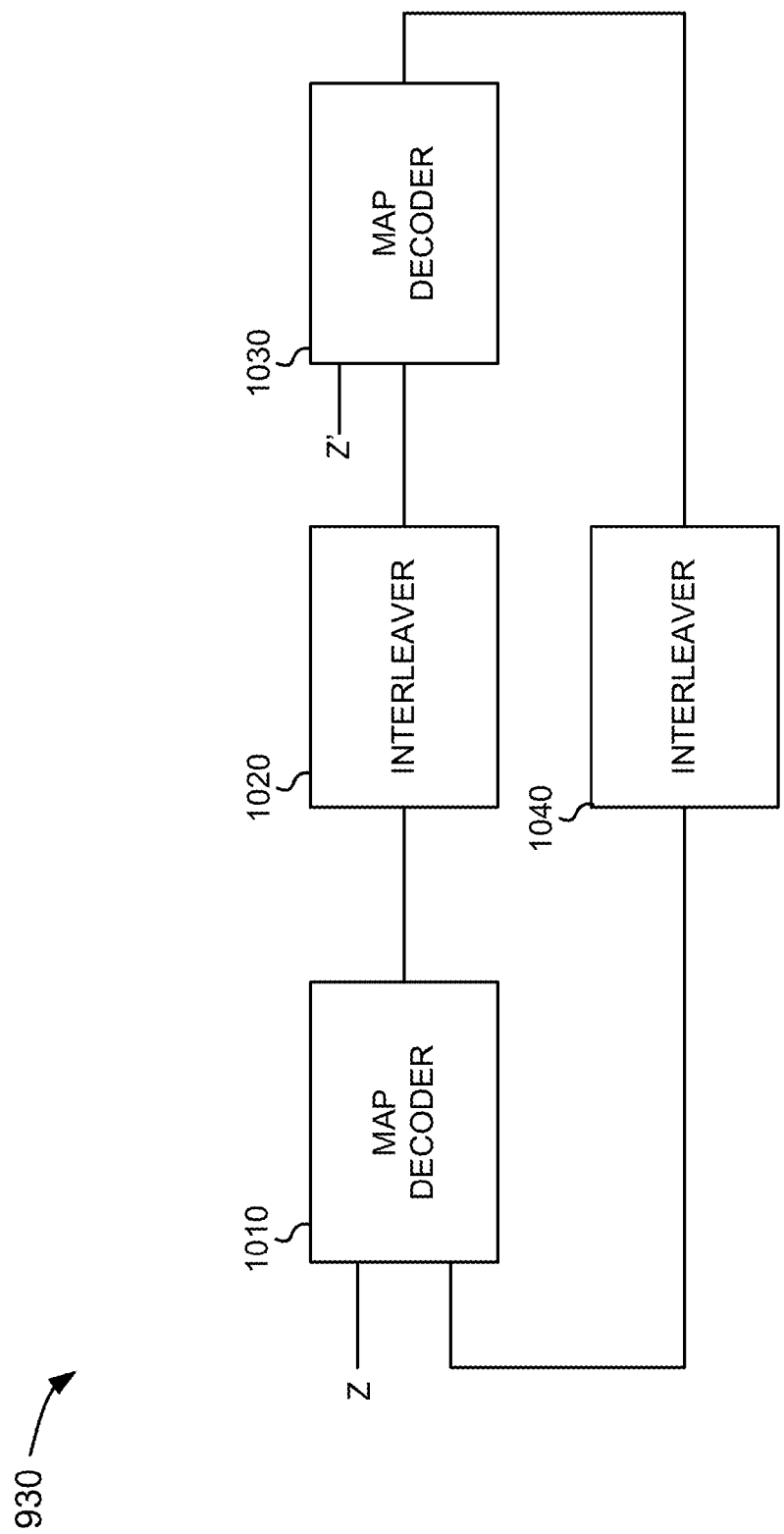
FIG. 10 is a diagram illustrating an example implementation of a turbo decoder.

FIG. 10 is a diagram illustrating an example implementation of a turbo decoder, such as turbo decoder 930. Turbo decoder 930 may include a pair of MAP decoders 1010 and 1030 and a pair of interleavers 1020 and 1040. Turbo decoder 930 may operate on blocks of data. MAP decoder 1010 may receive an initial block of data, including error correcting information, such as parity bits (labeled as input Z). MAP decoder 1030 may also receive the initial data, or a version of the initial block of data, and the error correcting information (labeled as input Z').

The output of MAP decoders 1010 and 1030 may be forwarded through the pair of interleavers 1020 and 1040. Interleavers 1020 and 1040 may generally operate to reorder input data. Interleavers 1020 and 1040 may be matched as interleaver/de-interleaver pairs, so that the interleaving performed by one of interleavers 1020 and 1040 can be undone by the other.

MAP decoders 1010 and 1030, and interleavers 1020 and 1040, may iteratively operate until the probabilities determined by MAP decoders 1010 and 1030, such as the LLR probabilities, converge.

The foregoing description of implementations provides illustration and description, but is not intended to be exhaustive or to limit the invention to the precise form disclosed. Modifications and variations are possible in light of the above teachings or may be acquired from practice of the invention.

For example, while a series of acts has been described with regard to FIGS. 6 and 8, the order of the acts may be modified in other implementations. Further, non-dependent acts may be performed in parallel.

Also, the term "user" has been used herein. The term "user" is intended to be broadly interpreted to include, for example, a workstation or a user of a workstation.

It will be apparent that embodiments, as described herein, may be implemented in many different forms of software, firmware, and hardware in the implementations illustrated in the figures. The actual software code or specialized control hardware used to implement embodiments described herein is not limiting of the invention. Thus, the operation and behavior of the embodiments were described without reference to the specific software code—it being understood that one would be able to design software and control hardware to implement the embodiments based on the description herein.

Further, certain portions of the invention may be implemented as "logic" that performs one or more functions. This logic may include hardware, such as an application specific integrated circuit or a field programmable gate array, software, or a combination of hardware and software.

Even though particular combinations of features are recited in the claims and/or disclosed in the specification, these combinations are not intended to limit the disclosure of the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method comprising:
   calculating, in parallel, products of cumulative products of:
      a series of transition matrices associated with an input array representing encoded data, and
      an initialization vector,
         the calculating the products of the cumulative products of the series of transition matrices and the initialization vector being performed by a device;
   calculating, based on the products of the cumulative products of the series of transition matrices and the initialization vector, an output array that corresponds to a decoded version of the encoded data,
      the calculating the output array being performed by the device; and
   outputting the output array,
      outputting the output array being performed by the device.

2. The method of claim 1, where calculating the products of the cumulative products of the series of transition matrices and the initialization vector includes:
   using a scan technique to convert the series of transition matrices and the initialization vector into the products of the cumulative products of the series of transition matrices and the initialization vector.

3. The method of claim 2, where calculating the products of the cumulative products of the series of transition matrices and the initialization vector includes:
   segmenting the series of transition matrices into a plurality of sections;
   independently applying, as a first scan, the scan technique to each of the plurality of sections to create a series of full products;
   applying, as a second scan, the scan technique to the series of the full products of the first scan of each of the plurality of sections to create partial product scan results; and
   distributing the partial product scan results from the second scan of each of the plurality of sections.

4. The method of claim 1, where calculating the products of the cumulative products of the series of transition matrices and the initialization vector includes:
   performing matrix by vector multiplications before performing matrix by matrix multiplications.

5. The method of claim 1, where calculating the products of the cumulative product of the series of transition matrices and the initialization vector includes:
   implementing N/2 parallel pipelines,
      where N represents a size of the input array,
      where each pipeline includes K stages, and
      where K corresponds to 2* log 2(N).

6. The method of claim 1, where calculating the products of the cumulative products of the series of transition matrices and the initialization vector includes:
   calculating the series of transition matrices from the input array.

7. The method of claim 1, where values in the series of transition matrices represent probabilities associated with state transitions in a Maximum A Posteriori Probability (MAP) decoder.

8. A non-transitory computer-readable medium storing instructions, the instructions comprising:
   one or more instructions that, when executed by one or more processors, cause the one or more processors to:
      calculate, in parallel, products of cumulative products of:
         a series of transition matrices associated with an input array representing encoded data, and
         an initialization vector;
      calculate, based on the products of the cumulative products of the series of transition matrices and the initialization vector, an output array that corresponds to a decoded version of the encoded data; and
      output the output array.

9. The non-transitory computer-readable medium of claim 8, where the one or more instructions to calculate the products of the cumulative products of the series of transition matrices and the initialization vector include:
   one or more instructions that, when executed by the one or more processors, cause the one or more processors to use a scan technique to convert the series of transition matrices and the initialization vector into the products of the cumulative products of the series of transition matrices and the initialization vector.

10. The non-transitory computer-readable medium of claim 9, where the one or more instructions to calculate the products of the cumulative products of the series of transition matrices and the initialization vector include:
   one or more instructions that, when executed by the one or more processors, cause the one or more processors to:
      segment the series of transition matrices into a plurality of sections;
      independently apply, as a first scan, the scan technique to each of the plurality of sections to create a series of full products;
      apply, as a second scan, the scan technique to the series of the full products of the first scan of each of the plurality of sections to create partial product scan results; and distribute the partial product scan results from the second scan of each of the plurality of sections.

11. The non-transitory computer-readable medium of claim 10, where the one or more instructions to output the output array include:
one or more instructions that, when executed by the one or more processors, cause the one or more processors to output data corresponding to a decoded version of the encoded data represented by the input array.

12. The non-transitory computer-readable medium of claim 8, where the one or more instructions to calculate the products of the cumulative products of the series of transition matrices and the initialization vector include:
one or more instructions that, when executed by the one or more processors, cause the one or more processors to calculate the series of transition matrices from the input array.

13. The non-transitory computer-readable medium of claim 12, where calculating the series of transition matrices and calculating the products of the cumulative products of the series of transition matrices and the initialization vector, are simultaneously performed for an alpha parameter of a Maximum A Posteriori Probability (MAP) decoder and a beta parameter of the MAP decoder.

14. The non-transitory computer-readable medium of claim 8, where values in the series of transition matrices represent probabilities associated with state transitions in a Maximum A Posteriori Probability (MAP) decoder.

15. A device comprising:
one or more processors to:
calculate, in parallel, products of cumulative products of:
a series of transition matrices associated with an input array representing encoded data, and
an initialization vector;
calculate, based on the products of the cumulative products of the series of transition matrices and the initialization vector, an output array that corresponds to a decoded version of the encoded data; and
output the output array.

16. The device of claim 15, where, when calculating the products of the cumulative products of the series of transition matrices and the initialization vector, the one or more processors are to:
use a scan technique to convert the series of transition matrices and the initialization vector into the products of the cumulative products of the series of transition matrices and the initialization vector.

17. The device of claim 16, where, when calculating the products of the cumulative products of the series of transition matrices and the initialization vector, the one or more processors are to:
segment the series of transition matrices into a plurality of sections;
independently apply, as a first scan, the scan technique to each of the plurality of sections to calculate full products for the plurality of sections;
apply, as a second scan, the scan technique to a series of the full products of the first scan of each of the plurality of sections to calculate partial product scan results; and
distribute the partial product scan results from the second scan of each of the plurality of sections.

18. The device of claim 15, where, when calculating the products of the cumulative products of the series of transition matrices and the initialization vector, the one or more processors are to:
calculate the series of transition matrices from the input array,
where calculating the series of transition matrices and calculating the products of the cumulative products of the series of transition matrices and the initialization vector, are simultaneously performed for an alpha parameter of a Maximum A Posteriori Probability (MAP) decoder and a beta parameter of the MAP decoder.

19. The device of claim 15, where values in the series of transition matrices represent probabilities associated with state transitions in a Maximum A Posteriori Probability (MAP) decoder.

20. The device of claim 15, where, when calculating the products of the cumulative products of the series of transition matrices and the initialization vector, the one or more processors are to:
perform matrix multiplication operations using a Max-Log-Map technique.

* * * * *